(12) United States Patent  (10) Patent No.: US 6,940,758 B2
Chung  (45) Date of Patent: Sep. 6, 2005

(54) FLASH MEMORY DEVICE WITH STABLE SOURCE LINE REGARDLESS OF BIT LINE COUPLING AND LOADING EFFECT

(75) Inventor: Hwi-Taek Chung, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 10/421,160

(22) Filed: Apr. 23, 2003

(65) Prior Publication Data

US 2004/0032763 A1 Feb. 19, 2004

(30) Foreign Application Priority Data

Aug. 14, 2002 (KR) .................................. 10-2002-0048041

(51) Int. Cl.[7] .............................................. G11C 16/00
(52) U.S. Cl. .......................... 365/185.25; 365/185.05; 365/185.17
(58) Field of Search ....................... 365/185.25, 185.11, 365/185.17, 185.05

(56) References Cited

U.S. PATENT DOCUMENTS

| | | | |
|---|---|---|---|
| 6,144,584 A | 11/2000 | Kunori et al. | ......... 365/185.18 |
| 6,266,274 B1 * | 7/2001 | Pockrandt et al. | ..... 365/185.17 |
| 6,556,475 B2 * | 4/2003 | Yamazaki et al. | ..... 365/185.03 |

* cited by examiner

Primary Examiner—Tan T. Nguyen
(74) Attorney, Agent, or Firm—Mills & Onello, LLP

(57) ABSTRACT

A flash memory device provides for a stable source line regardless of bit line coupling during a read operation and regardless of loading effect during a manufacturing process. The flash memory device includes: a plurality of flash memory cells arranged in rows and columns, each of the flash memory cells having a control gate, a source and a drain; a plurality of first, odd-numbered word lines each of which is connected with corresponding control gate of a first set of the flash memory cells; a plurality of second, even-numbered word lines each of which is connected with corresponding control gate of a second set of the flash memory cells; a plurality of bit lines each of which is connected with corresponding a drain of the flash memory cells; and a plurality of selection transistors connected between a source line and a discharge line, the source line being connected to sources of the first and second sets of flash memory cells, the selection transistors comprising the same structure as the first and second sets of the flash memory cells.

10 Claims, 6 Drawing Sheets

FLASH MEMORY DEVICE WITH STABLE SOURCE LINE REGARDLESS OF BIT LINE COUPLING AND LOADING EFFECT

BACKGROUND OF THE INVENTION

1. Field of the Invention

The present invention relates to a semiconductor memory device, and more particularly, to a flash memory device having a stable source line, irrespective of bit line coupling during a read operation and irrespective of loading effect experienced during a manufacturing process.

2. Discussion of the Related Art

Flash memory devices are widely deployed in computers and electronic communication systems that require a storage function. In flash memory devices, non-volatility and on-chip programmability are important factors for storing data in various applications. For example, flash memory devices are used to store BIOS startup information for a personal computer or to store programs or data files for portable equipment such as mobile telephones and digital cameras.

Unlike volatile memory devices such as dynamic random access memory (DRAM), the flash memory device performs erase and program operations. FIG. 1 is a cross-sectional view of a split-gate NOR flash memory device, and FIG. 2 is a schematic illustration of the flash memory cell which is an equivalent circuit of the split-gate NOR flash memory device of FIG. 1. Referring to FIG. 1, the split-gate NOR flash memory device 100 includes a source region 102 and a drain region 103 formed on a semiconductor substrate 101 and spaced apart from each other by the length of a channel region 104, a floating gate 105 formed over predetermined portions of the source region 102 and the channel region 104, and a control gate 106 formed over both the floating gate and the channel region 104 disposed at a lateral portion of the floating gate 105. The split-gate NOR flash memory device 100 performs a program operation by accumulating negative charge in the floating gate 105, and performs an erase operation by tunneling the accumulated charge to the control gate 106 at a peaked portion A of the floating gate 105.

In the schematic representation of the flash memory cell 200 of FIG. 2, a memory transistor 201 and a selection transistor 202 are serially connected between a source line SL and a bit line BL and gated to a word line WL. The program or erase operation of the flash memory cell 200 is achieved under the conditions of TABLE 1.

TABLE 1

| OPERATING MODE | SELECT/ UNSELECTED | BL | WL | SL | BULK |
|---|---|---|---|---|---|
| PROGRAM MODE | SELECTED | 0 V | VT (1.5 V) | Vpp (10 V) | 0 V |
| | UNSELECTED | VCC | 0 V | 0 V | 0 V |
| ERASE MODE | SELECTED | 0 V | Vee (12 V) | 0 V | 0 V |
| | UNSELECTED | 0 V | 0 V | 0 V | 0 V |
| READ MODE | SELECTED | 1 V | Vread (3 V) | 0 V | 0 V |
| | UNSELECTED | 0 V | 0 V | 0 V | 0 V |

In TABLE 1, when applying 0 V to the bit line BL, 1.5 V (threshold voltage of transistor) to the word line WL, 10 V (high voltage Vpp) to the source line SL and a bulk voltage of 0 V, charge is accumulated in the floating gate 105 of the memory transistor 201 to thereby achieve the program operation of the flash memory cell 200. If applying 0 V to the bit line BL, 12 V (erase voltage Vee) to the word line WL, 0 V to the source line SL and a bulk voltage of 0 V, the accumulated charge of the floating gate 105 is discharged to thereby achieve the erase operation of the flash memory cell 200. The read operation of the flash memory cell 200 is achieved by applying 1 V to the bit line BL, 3 V (read voltage Vread) to the word line WL, 0 V to the source line SL and a bulk voltage of 0 V. At this time, if a selected memory cell is a programmed cell, current does not flow between the drain and the source of the memory transistor 201, and thus, the memory cell is referred to as being "off". Meanwhile, if a selected cell is an erased cell, constant current flows between the drain and the source of the memory transistor 201, and thus, the memory cell is referred to as being "on".

Memory cell array blocks 300 and 400 consisting of these memory cells are shown in FIGS. 3 and 4. FIG. 3 is a view of a conventional memory cell array block 300 in which a plurality of bit lines are connected with one I/O line. Referring to FIG. 3, the memory cell array block 300 includes n×m memory cells Q1 to Q16 connected with n word lines WL and m bit lines BL, selection transistors QS1 to QS4 connected with n/2 source lines SL1 to SLn/2, column selection transistors NM1 to NM6 connected with column addresses YA1, YAi, YB1 and YBj, a discharge transistor NM7 connected with a source line discharge signal SL__DIS, and a source line decoder 310. For example, the memory cells Q1 to Q8 and the selection transistors QS1 and QS2, which are connected with the first and second word lines WL1 and WL2, are connected with the first source line SL1, thereby forming one page unit PAGE1. Hence, the memory cell array block 300 is constituted with n/2 pages and each page is a basic unit of an erase mode. The source line decoder 310, which will be described below, controls the application of 0 V or VPP voltage to the source lines SL1 to SLn/2 according to the mode of operation. Data of the selected memory cells Q1 to Q16 are connected with a sense amplifier S/A via the column selection transistors NM1 to NM6 and transmitted to the I/O line.

Recently, meanwhile, micro controllers with built-in non-volatile memory (NVM) or smart cards with built-in CPU capability tend to require memory devices with ever-increasing capacity. While a conventional EEPROM provided with memory cells consisting of two transistors offers the advantage that the program and erase operations can be performed based on byte and page units, it also has the disadvantage that the cell size is comparably large. While an EPROM offers the advantage that the cell size is small, it has a disadvantage that it cannot be used as a data memory device since it cannot be erased while mounted to a circuit board. Particularly, for a smart card application, where there is a demand for large-capacity program memory and data memory capable of performing the program and erase operations, whether in units of bytes or pages, the flash memory devices are employed. Although flash memory devices suffer from problems such as increased layout area consumption when the program and erase operations are performed using the byte mode, these problems can be solved by reducing the page unit using small bytes. FIG. 4 illustrates a memory cell array block 400 having a plurality of I/O lines I/O1 to I/Ok, in which the page unit size is reduced. Respective bit lines BL1 to BLk are connected with sense amplifiers S/A1 to S/Ak via transistors NM1 to NM4 gated to a column selection signal YSEL and are connected with I/O lines I/O1 to I/Ok.

The memory cell array blocks 300 and 400 operate as shown in TABLE 1. For example, during a read operation, when the source lines SL1 to SLn/2 (on the whole, referred to as "SLi") are set to a ground voltage (VSS), cell currents of the selected memory cells can flow. The sense amplifiers S/A sense and amplify the cell currents and transmit memory cell data to the I/O lines I/Ok. Meanwhile, during the read operation, if "on" cells exist adjacent to "off" cells, the voltage levels of the bit lines corresponding to the "on" cells will become reduced, due to the cell currents, and voltage levels of the bit lines corresponding to the "off" cells are also reduced due to coupling between adjacent bit lines, causing the problem that the cell currents can flow through the "off" cells like they do through the "on" cells. This phenomenon causes a read failure. Even if discharge path within the source decoder 310 is large, potentials of the source lines SLi do not fully become the ground voltage (VSS), but rather rise to some extent due to junction diffusion resistance and line resistance, which are caused by an arrangement of the source lines SLi. In this case, the potentials of the source lines SLi can be made to go down by forming additional discharge paths on the source lines SLi or by using a metal strapping method.

However, the method of forming additional discharge paths carries with it the disadvantage that the chip may increase in size. Also, the method of forming metal strapping or transistors between the memory cell array and with a different shape from the memory cell patterns is limited by resulting degradation of the characteristics of the memory cells due to loading effect which occurs in the memory cells during manufacturing processes.

Therefore, there is an increased demand for memory cells capable of solving the rising voltage problem of the source lines, without increasing the size thereof and without worsening the loading effect of the memory cells.

SUMMARY OF THE INVENTION

Accordingly, the present invention is directed to a flash memory device with a stable source line that substantially obviates one or more of the limitations and disadvantages of the related art.

An object of the present invention is to provide a flash memory device having memory cell arrays capable of mitigating or eliminating the voltage rising problem at the source lines during a read operations.

To achieve these objects and other advantages and in accordance with the purpose of the invention, as embodied and broadly described herein, a high voltage is provided in accordance with the present invention.

In one aspect of the present invention, a flash memory device comprises: a plurality of flash memory cells arranged in rows and columns, each of the flash memory cells having a control gate, a source and a drain; a plurality of first word lines each of which is connected with a corresponding control gate of a first set of the flash memory cells; a plurality of second word lines each of which is connected with a corresponding control gate of a second set of the flash memory cells; a plurality of bit lines each of which is connected with a corresponding drain of the flash memory cells; and a plurality of selection transistors connected between a source line and a discharge line, the source line being connected to sources of the first and second sets of the flash memory cells, the selection transistors having the same structure as the first and second sets of the flash memory cells.

The flash memory cells and the selection transistors are preferably split-gate flash memory cells. The discharge line is preferably connected with an output of an inverter receiving a source line discharge signal.

In another aspect of the present invention, a flash memory device comprises: a plurality of flash memory cells arranged in rows and columns, each of the flash memory cells having a control gate, a source and a drain; a plurality of a first word lines each of which is connected with corresponding control gate of a first set of the flash memory cells; a plurality of second word lines each of which is connected with corresponding control gate of a second set of the flash memory cells; a plurality of bit lines each of which is connected with a corresponding drain of the flash memory cells; and a plurality of selection transistors disposed between adjacent bit lines, each of the selection transistors being connected between a corresponding source line and a corresponding discharge line, the source line being connected to sources of the first and second sets of the flash memory cells, the selection transistors having the same structure as the first and second sets of the flash memory cells.

In this manner, according to the memory cell array block of the present invention, since the source line discharge path has the same structure as the memory cell, the loading effect which otherwise would be generated due to different patterns within the memory cell array is mitigated or eliminated. Further, since the discharge lines and the selection transistors for discharging the source lines are arranged between the bit lines, the source lines are coupled due to the voltage rising of the bit lines, so that read failure that otherwise would be caused due to coupling between adjacent bit lines does not occur during the read operation.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFRRED EMBODIMENTS

Figure 5:
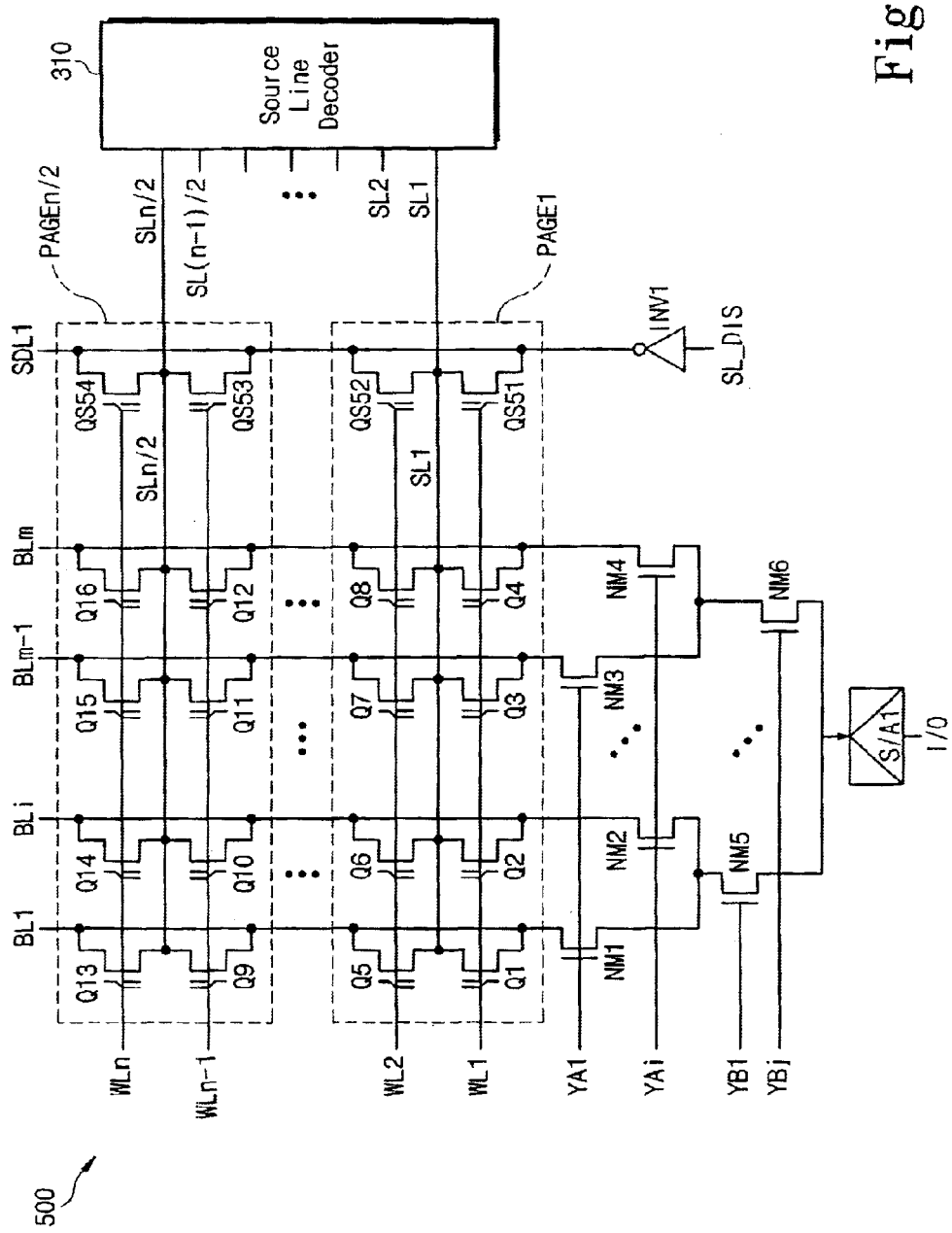
FIG. 5 is a schematic diagram of a flash memory cell array in which a plurality of bit lines are connected with a single I/O line in accordance with an embodiment of the present invention.

FIG. 5 is a schematic diagram of a flash memory device in accordance with an embodiment of the present invention.

Figure 1:
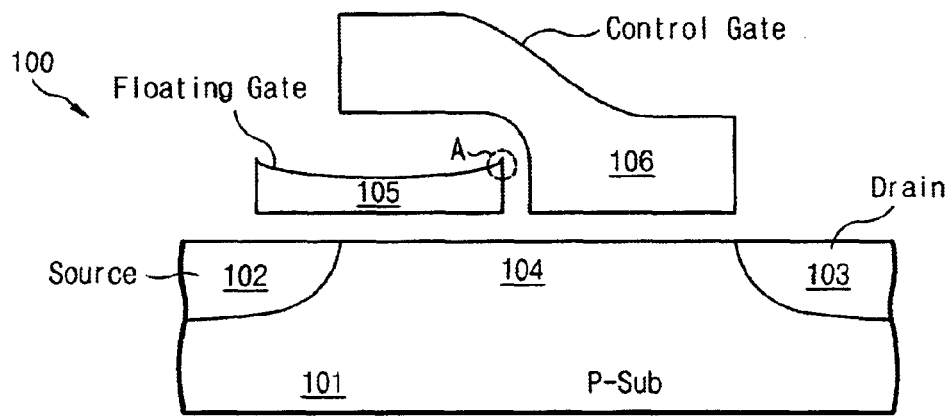
FIG. 1 is a cross-sectional view of a conventional split-gate NOR flash memory device.
Figure 2:
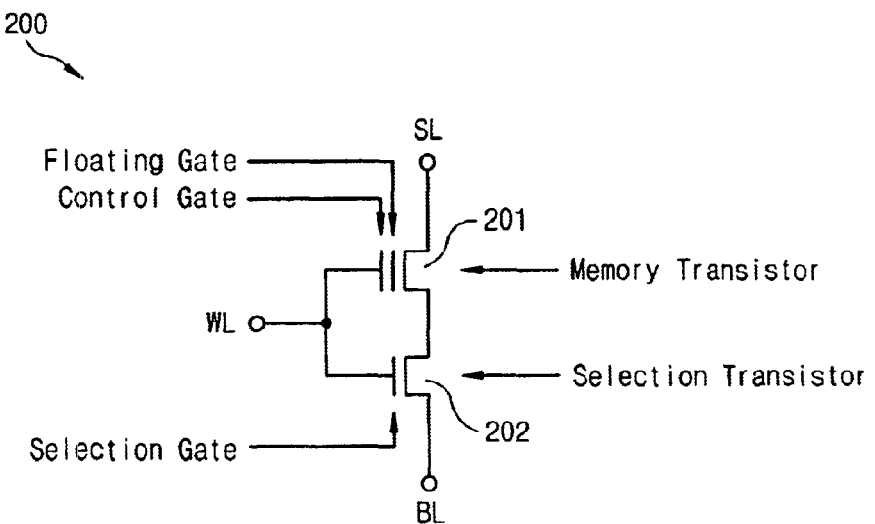
FIG. 2 is a schematic diagram of a flash memory cell which is an equivalent circuit of the split-gate NOR flash memory device of FIG. 1.
Figure 3:
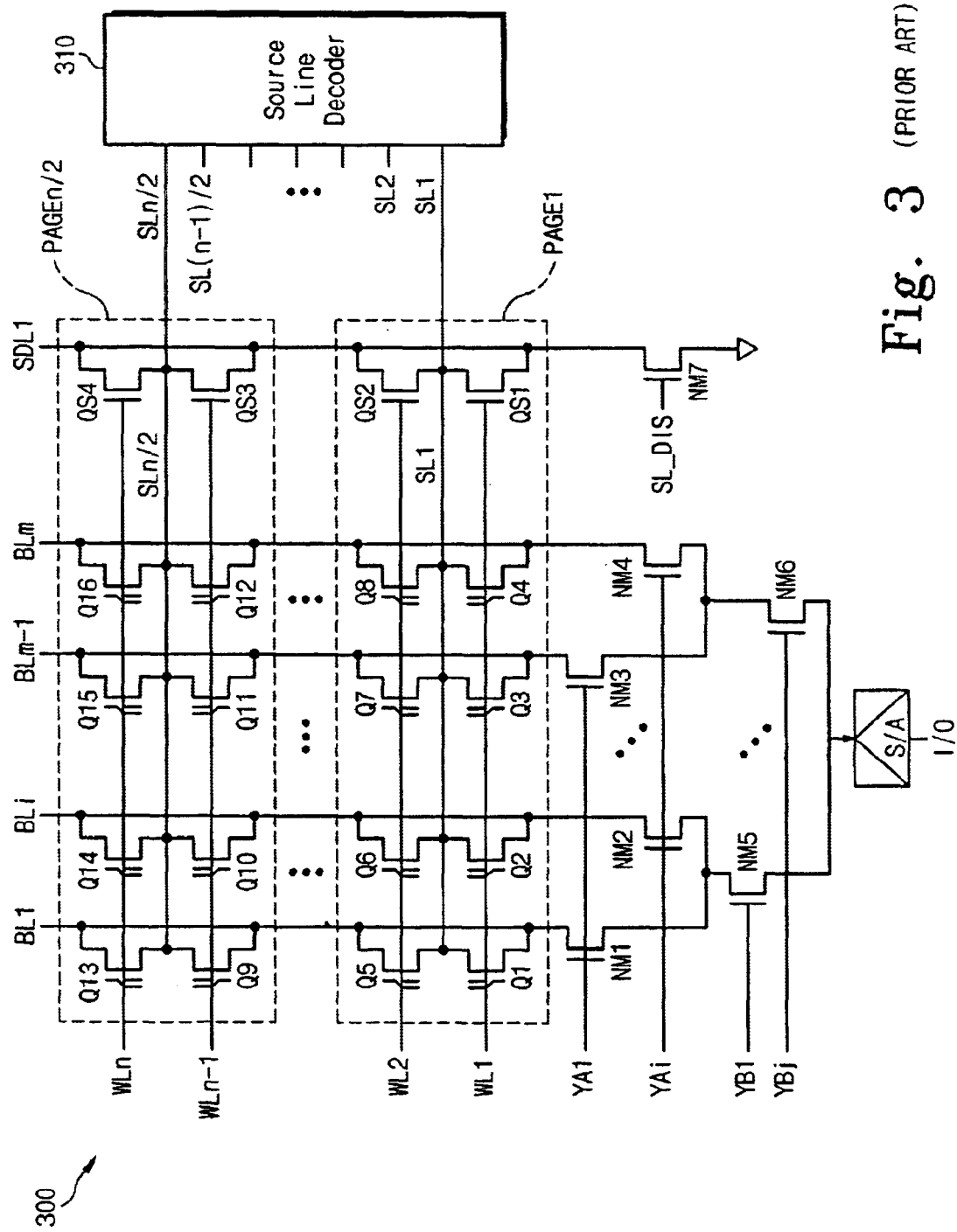
FIG. 3 is a schematic diagram of a conventional flash memory cell array in which a plurality of bit lines are connected with a single I/O line.

Referring to FIG. 5, as compared with the conventional memory cell array block 300 of FIG. 3 in which the selection transistors QS1 to QS4 connected with the source lines SLi are comprised of common transistors, the memory cell array block 500 of FIG. 5 includes selection transistors QS51 to QS54 comprising the same structure as memory cell transistors Q1 to Q16. In other words, both the memory cell transistors Q1 to Q16 and the selection transistors QS51 to QS54 are of the form of split-gate transistors, for example of the type shown in FIG. 1. While the memory cell transistors Q1 to Q16 are "off" cells that are selectively programmed or "on" cells that are unprogrammed, the selection transistors QS51 to QS54 are "on" cells that are unprogrammed. In this configuration, the source line discharge signal SL_DIS is inverted via an inverter INV1 and transmitted to the discharge line SDL1.

In this case, a voltage of 0 V is applied to the discharge line SDL1 used as a source line discharge path in the read and erase modes, and a voltage of a power supply voltage (VCC) or a program inhibit voltage is applied to the discharge line SDL1 in the program mode. Thus, the selection transistors QS51 to QS54 are always maintained in the erase mode and cause the source lines SLi to be grounded in the read mode. Even in the case where a selected page is erased one time, the selection transistors QS51 to QS54 used as the source line discharge path are erased to thereby operate as "on" cells. Even in the case where the program operation is performed within the selected page, the selection transistors QS51 to QS54 are not programmed. Therefore, the selection transistors QS51 to QS54 that are substituted for the conventional normal transistors function to eliminate the loading effect problem that otherwise may be generated within the memory cell array.

Figure 6:
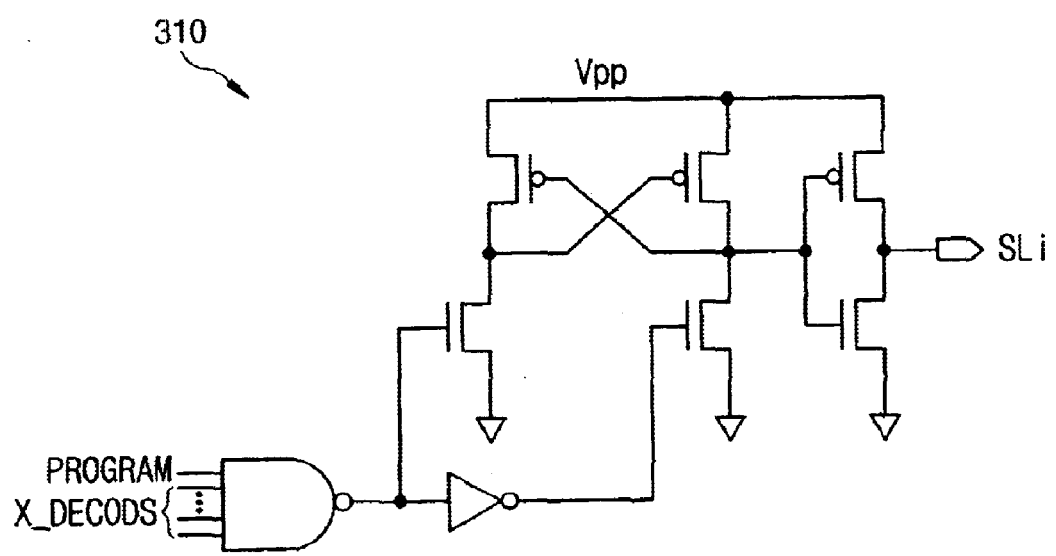
FIG. 6 is a schematic diagram of the source line decoder for the cell array shown in FIG. 5.

In the program mode, the source line decoder 310 supplies the power supply voltage (VCC) to the source lines SLi. A schematic representation of an example source line decoder 310 is illustrated in detail in FIG. 6. Referring to FIG. 6, the source line decoder 310 supplies selected source lines SLi with the high voltage (Vpp) of about 10 V or the ground voltage (VSS) of 0 V in response to a program signal PROGRAM and combination signals X_DECODS of low address signals. In this example, the program signal PROGRAM is a signal instructing to the memory cells to perform the program operation.

Hereinafter, an operation of the memory cell array block 500 will be described in detail with reference to FIG. 5. An example is provided of the program, erase and read operations with respect to the memory cell Q1. The memory cell Q1 is selected by the first word line WL1 and the first bit line BL1. Here, the first world line WL1 is enabled by a row decoder (not shown) and the first bit line BL1 is selected by the column selection signals YA1 and YB1. In the program mode of the memory cell Q1, the threshold voltage (VT) of about 1.5 V is applied to the first word line WL1, the high voltage (Vpp) of about 10 V is applied to the first source line SL1 by the source line decoder 310, and the ground voltage (VSS) of 0 V is applied to the first bit line BL1, so that the memory cell Q1 is programmed. In the erase mode, since the memory cells are erased according to page unit, the erase voltage (Veep) of about 12 V is applied to the first and second world lines WL1 and WL2, and the discharge line SDL1 is set to a low level by the source line discharge signal SL_DIS at a high level. Also, the first selection transistor QS51 connected with the first and second word lines WL1 and WL2 is turned on to transfer the low level of the discharge line SDL1 to the first source line SL1, and the ground voltage of 0 V is applied to all the selected bit lines BL1, BLi, BLm-1, and BLm, so that all the memory cells Q1 to Q8 disposed within the first page are erased. In the read mode, the read voltage (Vread) of about 3 V is applied to the first word line WL1, and the discharge line SDL1 is set to a low level by the source line discharge signal SL_DIS at a high level. Also, the first selection transistor QS51 connected with the first word line WL1 is turned on to transfer the low level of the discharge line SDL1 to the first source line SL1, and the voltage of about 1 V is applied to the selected bit line BL1, so that data of the memory cell Q1 is read.

Therefore, according to the memory cell array block 500 of the present invention, the source line discharge path has the same structure as that of the memory cell, so that the loading effect that would otherwise be generated due to different patterns within the memory cell array does not occur.

Figure 4:
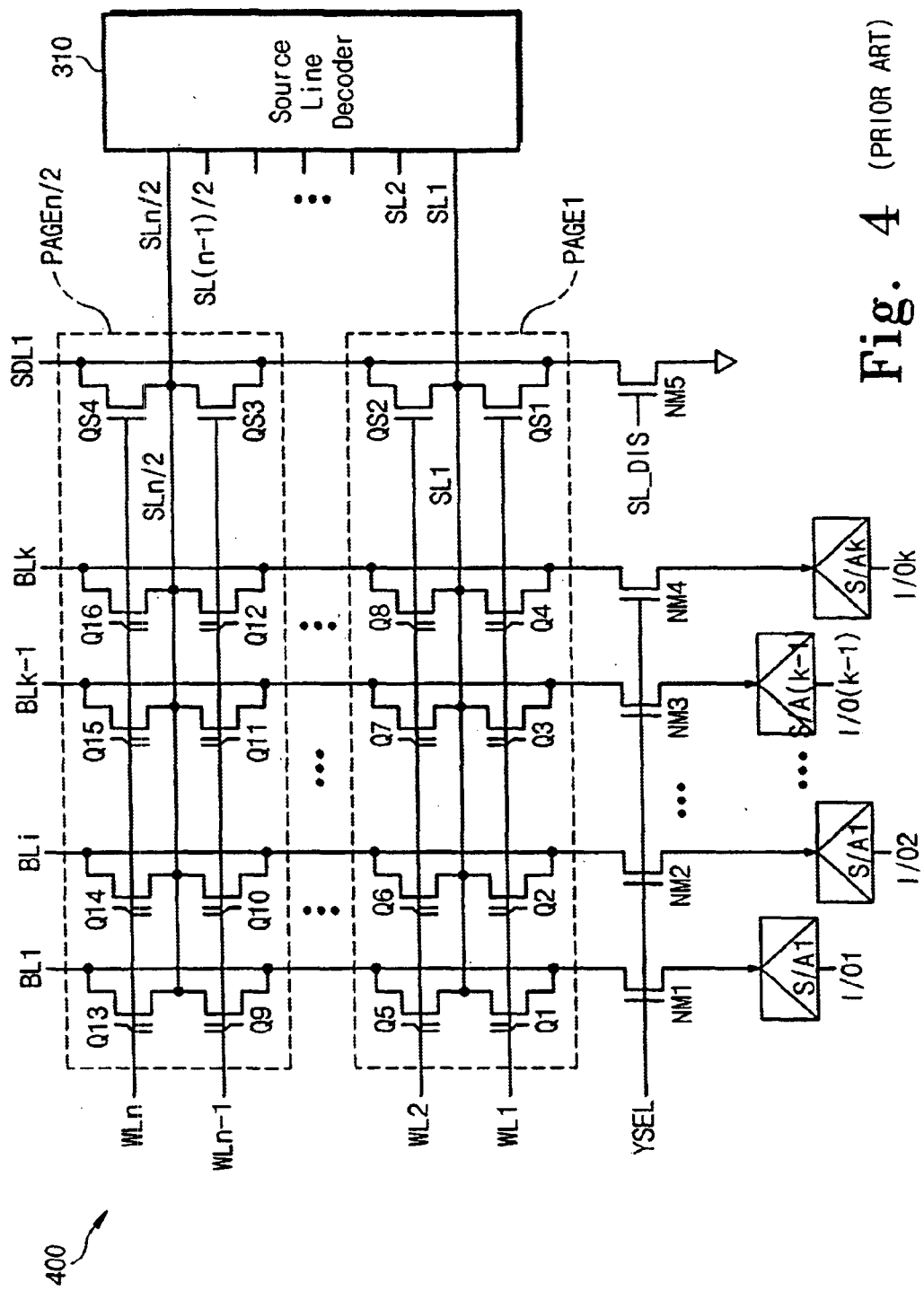
FIG. 4 is a schematic diagram a conventional flash memory cell array having a plurality of I/O lines, in which respective bit lines are connected with corresponding I/O lines.
Figure 7:
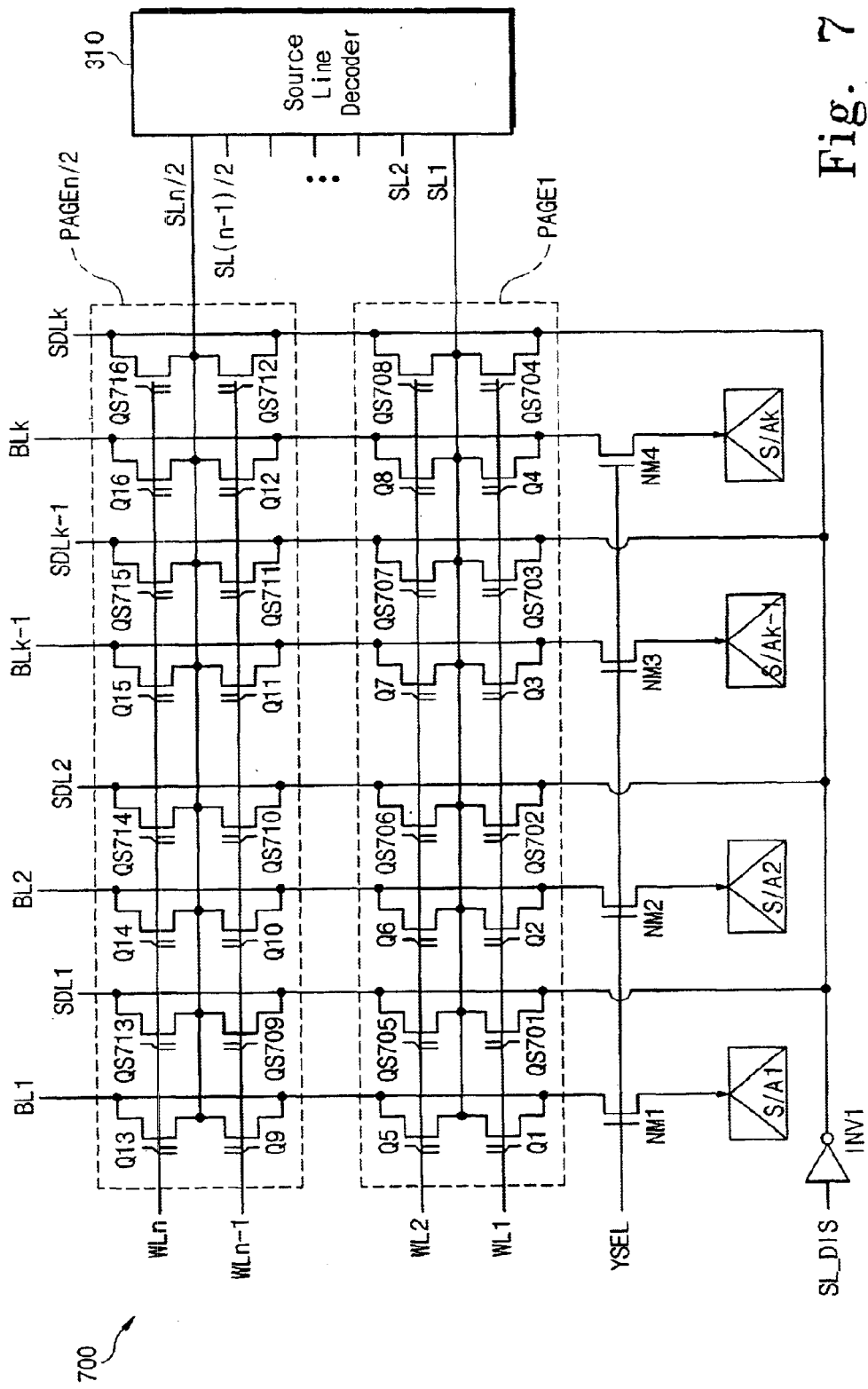
FIG. 7 is a schematic diagram of a flash memory cell array having a plurality of I/O lines, in which respective bit lines are connected with corresponding I/O lines in accordance with another embodiment of the present invention.

FIG. 7 is a schematic diagram of a memory cell array block in accordance with another embodiment of the present invention. Compared the memory cell array block 700 of FIG. 7 with that of FIG. 4, a difference lies in that the memory cell array block 700 includes discharge lines SDL1 to SDLk connected with selection transistors QS701 to QS716 and arranged between the bit lines BL1 to BLk. Another difference lies in that the selection transistors QS701 to QS716 have the same structure as that of the split-gate memory cells Q1 to Q16. In other words, like the selection transistors QS51 to QS54 of FIG. 5, the selection transistors QS701 to QS716 are provided with spilt-gate transistors.

In the memory cell array block 700, since the discharge lines SDL1 to SDLk are arranged between the bit lines BL1 to BLk and discharges source lines SLi, a read failure that otherwise would be caused due to coupling between adjacent bit lines, is mitigated or eliminated during the read operation.

Program, erase and read operations of the memory cell array block 700 of FIG. 7 are identical to those of the memory cell array block 500 of FIG. 5. A detailed description thereof is therefore omitted.

Although the split-gate flash memory cells are exemplarily described, the present invention is also applicable to flash memory cells having various structures other than the split gate structure.

While this invention has been particularly shown and described with references to preferred embodiments thereof, it will be understood by those skilled in the art that various changes in form and details may be made herein without departing from the spirit and scope of the invention as defined by the appended claims.

Therefore, according to the memory cell array block of the present invention, since the source line discharge path has the same structure as the memory cell, the loading effect that otherwise would be caused due to the existence of different patterns within the memory cell array is mitigated or eliminated. In addition, read failure that otherwise would be caused due to coupling between adjacent bit lines is mitigated or eliminated during the read operation.

What is claimed is:

1. A flash memory device comprising:
   a plurality of flash memory cells arranged in rows and columns, each of the flash memory cells having a control gate, a source and a drain;
   a plurality of first word lines each of which is connected with corresponding control gates of a first set of the flash memory cells;

a plurality of second word lines each of which is connected with corresponding control gates of a second set of the flash memory cells;

a plurality of bit lines each of which is connected with a corresponding drain of the flash memory cells; and a plurality of selection transistors connected between a source line and a discharge line, the source line being connected to sources of the first and second sets of the flash memory cells, the selection transistors comprising the same structure as the first and second sets of the flash memory cells.

2. The flash memory device of claim 1, wherein the flash memory cells and the selection transistors comprise split-gate flash memory cells.

3. The flash memory device of claim 1, wherein the discharge line is connected to an output of an inverter receiving a source line discharge signal.

4. The flash memory device of claim 1, wherein the discharge line is at a logic high level when in a program mode and at a logic low level of a ground voltage when in an erase mode and a read mode.

5. The flash memory device of claim 1, further comprising a plurality of dummy flash memory cells arranged on borders of the flash memory device, each of the dummy flash memory cells having a control gate, a source and a drain, wherein logic high levels are applied to bit lines of the dummy flash memory cells in a program mode and logic low levels of a ground voltage are applied to the dummy flash memory cells in an erase mode and a read mode.

6. A flash memory device comprising:

a plurality of flash memory cells arranged in rows and columns, each of the flash memory cells having a control gate, a source and a drain;

a plurality of first word lines each of which is connected with corresponding control gates of a first set of the flash memory cells;

a plurality of second word lines each of which is connected with corresponding control gates of the second set of the flash memory cells;

a plurality of bit lines each of which is connected with a corresponding drain of the flash memory cells; and a plurality of selection transistors disposed between adjacent bit lines, each of the selection transistors being connected between a corresponding source line and a corresponding discharge line, the source line being connected to sources of the first and second sets of the flash memory cells, the selection transistors comprising the same structure as the first and second sets of the flash memory cells.

7. The flash memory device of claim 6, wherein the flash memory cells and the selection transistors comprise split-gate flash memory cells.

8. The flash memory device of claim 6, wherein the discharge line is connected to an output of an inverter receiving a source line discharge signal.

9. The flash memory device of claim 6, wherein the discharge line is at a logic high level when in a program mode and at a logic low level of a ground voltage when in an erase mode and a read mode.

10. The flash memory device of claim 6, further comprising a plurality of dummy flash memory cells arranged on borders of the flash memory device, each of the dummy flash memory cells having a control gate, a source and a drain, wherein logic high levels are applied to bit lines of the dummy flash memory cells in a program mode and logic low levels of a ground voltage are applied to the dummy flash memory cells in an erase mode and a read mode.

* * * * *